United States Patent
Jin et al.

(10) Patent No.: US 8,560,262 B2
(45) Date of Patent: Oct. 15, 2013

(54) METHODS FOR MANUFACTURING DEVICES WITH FLEX CIRCUITS AND RADIO-FREQUENCY CABLES

(75) Inventors: Nanbo Jin, Sunnyvale, CA (US); Mattia Pascolini, Campbell, CA (US); Qingxiang Li, Mountain View, CA (US); Dean Darnell, San Jose, CA (US); Robert W. Schlub, Cupertino, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 260 days.

(21) Appl. No.: 12/969,957

(22) Filed: Dec. 16, 2010

(65) Prior Publication Data

US 2011/0313708 A1      Dec. 22, 2011

Related U.S. Application Data

(60) Provisional application No. 61/356,378, filed on Jun. 18, 2010.

(51) Int. Cl.
   *G06F 19/00* (2011.01)
(52) U.S. Cl.
   USPC .......................................................... 702/117
(58) Field of Classification Search
   USPC .......................................................... 702/117
   See application file for complete search history.

(56) References Cited

U.S. PATENT DOCUMENTS

| 5,119,020 A * | 6/1992 | Massey et al. ........... 324/755.01 |
| 7,400,255 B2 | 7/2008 | Horch |
| 2007/0040688 A1 | 2/2007 | Cocita et al. |

FOREIGN PATENT DOCUMENTS

WO     2009105885     9/2009

OTHER PUBLICATIONS

A Review of Flexible Circuit Technology and its Applications, ISBN1-84402-023-1 Flexible Circuit Technology Jun. 2002, Published in 2002 by PRIME Faraday Partnership Wolfson School of Mechanical and Manufacturing Engineering Loughborough University, Loughborough, Leics LE11 3TU, 59 pages.*
Balint Balogh, Qualification and Reliability Tests of Flexible Printed Circuits, 2007 IEEE, Department of Electronics Technology, Budapest University of Technology and Economics, p. 82-87.*

* cited by examiner

*Primary Examiner* — Tung S Lau
(74) *Attorney, Agent, or Firm* — Treyz Law Group; Jason Tsai (57) ABSTRACT

A flex circuit may have test structures and antenna structures. The test structures may include test capacitors and transmission lines. The performance of the test structures may be measured using test equipment. Pass/fail criteria may be applied to the flex circuit based on the measured values. If the flex circuit is a failing circuit, flex circuit manufacturing settings may be adjusted. The performance of a radio-frequency (RF) cable may also be measured using the test equipment. Sample portions of the RF cable may be obtained and measured. Pass/fail criteria may be applied to the RF cable based on measured cable loss values. If the RF cable is a failing cable, RF cable manufacturing settings may be adjusted. Antenna structures associated with passing flex circuits and RF cable segments associated with passing sample RF cable segments may be incorporated into a wireless device during production device assembly.

16 Claims, 11 Drawing Sheets

METHODS FOR MANUFACTURING DEVICES WITH FLEX CIRCUITS AND RADIO-FREQUENCY CABLES

This application claims the benefit of provisional patent application No. 61/356,378, filed Jun. 18, 2010, which is hereby incorporated by reference herein in its entirety.

BACKGROUND

This relates generally to flexible electronics, and more particularly, to testing and monitoring the performance of flexible electronics during manufacturing.

Wireless electronic devices such as cellular telephones include numerous electronic and mechanical components. Flexible printed circuits (also referred to as "flex circuits") and rigid printed circuit boards (rigid PCBs) are commonly used as substrates for these components in wireless devices.

Flex circuits are typically manufactured using roll-to-roll (R2R) processing. Roll-to-roll processing involves patterning electronic circuits on a roll of flexible substrate (e.g., a sheet of polyimide or other flexible polymer sheet).

In an effort to monitor the quality of the circuits that are being formed, token test structures may be included on each roll of flex circuit. These token test structures can be characterized using test equipment.

In some devices, flex circuits are used in forming radio-frequency circuits such as antenna structures and transmission lines.

It would be desirable to be able to provide ways in which to characterize the quality of these structures so that devices that are manufactured using these structures will perform properly.

SUMMARY

A wireless electronic device may include wireless circuitry such as transceiver circuitry and antenna circuitry connected through a radio-frequency (RF) cable. The RF cable may, for example, be a coaxial cable. The antenna may be manufactured on a flexible printed circuit board (sometimes referred to as a "flex circuit").

A roll of flex circuit may include multiple antenna structures and antenna test structures ("tokens") formed periodically throughout the flex circuit. For example, one block of test structures may be formed for every 100 antenna structures. Each block of test structures may include a first capacitor, a second capacitor, a transmission line, etc. Connectors may be soldered or otherwise connected to each of the test structures so that the test structures may be connected to test equipment (e.g., a vector network analyzer) to obtain measurement data.

The first capacitor may be measured to calculate flex circuit board thickness, the second capacitor may be measured to determine edge effect sensitivity, and the transmission line may be measured for its characteristic impedance. This measurement data and other measurement data gathered from the test structures may reveal information regarding the performance of the antenna structures formed on the same roll of flex circuit. If the measurement values do not satisfy pass/fail criteria, the antenna structures may be discarded or reworked and/or flex circuit manufacturing settings may be adjusted to correct for flex circuit manufacturing non-idealities.

The RF cable may also be measured using the test equipment. Sample RF cable segments may be obtained from different portions of the RF cable. The sample RF cable segments may have terminals that are soldered or otherwise connected to RF connectors. The cable loss of each sample RF cable segment may be measured using the test equipment. If the cable loss values do not satisfy predetermined performance criteria, RF cable manufacturing settings may be adjusted to correct for cable manufacturing non-idealities and the unsatisfactory cable may be discarded.

Antenna structures associated with flex circuits that contain passing antenna test structures and RF cable associated with passing sample RF cable segments may be assembled in a production wireless device (e.g., an RF cable segment may be used to connect an antenna structure to transceiver circuitry mounted within a device housing). Testing and monitoring the quality of flex circuits and RF cables in this way may be used during pre-production testing phases and during actual production of wireless devices.

Further features of the present invention, its nature and various advantages will be more apparent from the accompanying drawings and the following detailed description.

DETAILED DESCRIPTION

Figure 1:
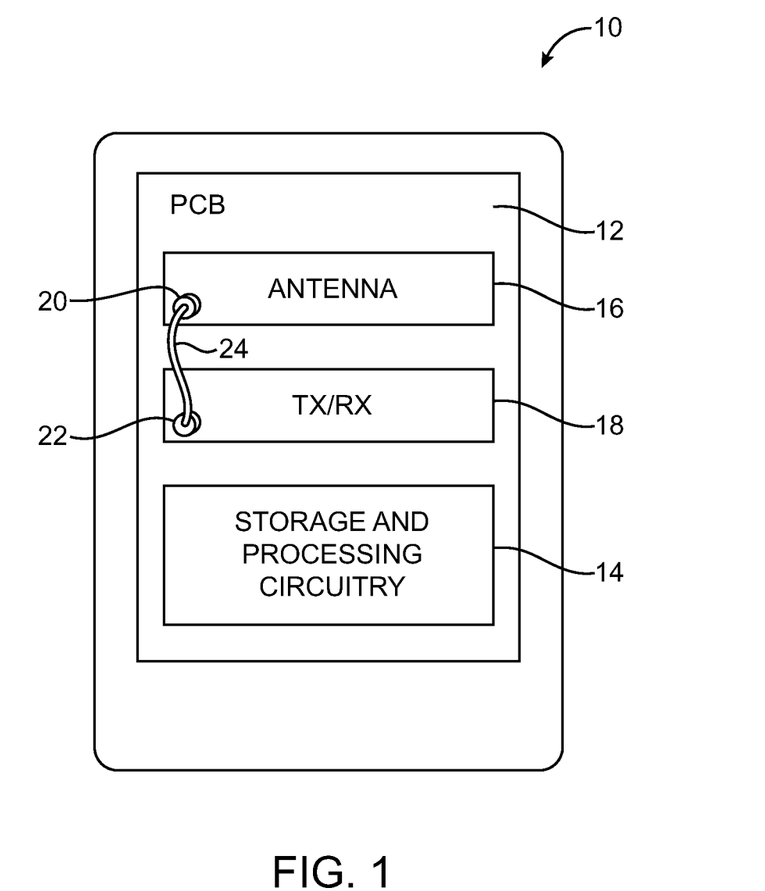
FIG. 1 is a diagram of an illustrative wireless electronic device in accordance with an embodiment of the present invention.

An illustrative electronic device of the type that may be provided with flexible electronics is shown in FIG. 1. Electronic devices such as device 10 of FIG. 1 may be laptop computers, tablet computers, cellular telephones, media players, other handheld and portable electronic devices, smaller devices such as wrist-watch devices, pendant devices, headphone and earpiece devices, other wearable and miniature devices, or other electronic equipment.

As shown in FIG. 1, device 10 may include storage and processing circuitry such as storage and processing circuitry 14 and wireless communications circuitry such as antenna circuitry 16 and transceiver circuitry 18 mounted on a substrate such as printed circuit board (PCB) 12. Printed circuit board 12 may be a rigid printed circuit board such as a fiberglass-filled epoxy substrate and/or a flex circuit (as examples).

Storage and processing circuitry 14 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 14 may be used to control the operation of device 10. This processing circuitry may be based on one or more microprocessors, microcontrollers, digital signal processors, application specific integrated circuits, etc.

Storage and processing circuitry 14 may be used to run software on device 10, such as internet browsing applications, voice-over-internet-protocol (VOIP) telephone call applications, email applications, media playback applications, operating system functions, etc. To support interactions with external equipment, storage and processing circuitry 14 may be used in implementing communications protocols. Communications protocols that may be implemented using storage and processing circuitry 14 include internet protocols, wireless local area network protocols (e.g., IEEE 802.11 protocols—sometimes referred to as WiFi®), protocols for other short-range wireless communications links such as the Bluetooth® protocol, cellular telephone protocols, MIMO protocols, antenna diversity protocols, etc.

The wireless communications circuitry (e.g., antenna 16 and transceiver 18) in device 10 may be used to form remote and local wireless links. One or more antennas may be used during wireless communications. Single band and multiband antennas may be used. For example, a single band antenna may be used to handle local area network communications at 2.4 GHz (as an example). As another example, a multiband antenna may be used to handle cellular telephone communications in multiple cellular telephone bands. Antenna 16 may also be used to receive global positioning system (GPS) signals at 1575 MHz in addition to cellular telephone signals and/or local area network signals. Other types of communications links may also be supported using single-band and multiband antennas.

Antenna 16 in device 10 may be used to support any communications bands of interest. For example, device 10 may include antenna structures for supporting local area network communications (e.g., IEEE 802.11 communications at 2.4 GHz and 5 GHz for wireless local area networks), signals at 2.4 GHz such as Bluetooth® signals, voice and data cellular telephone communications (e.g., cellular signals in bands at frequencies such as 850 MHz, 900 MHz, 1800 MHz, 1900 MHz, 2100 MHz, etc.), global positioning system (GPS) communications at 1575 MHz, signals at 60 GHz (e.g., for short-range links), etc.

Antenna 16 may be formed using any suitable antenna types. For example, antenna 16 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna. Antenna structures for antennas 16 may be formed from traces on flex circuits, traces on rigid printed circuit board substrates, housing structures, etc.

Transceiver circuitry 18 may be formed from one or more integrated circuits, power amplifier circuitry, low-noise input amplifiers, passive radio-frequency (RF) components, and other circuitry for handling RF wireless signals. Wireless signals can also be sent using light (e.g., using infrared communications).

Transceiver circuitry 18 may handle 2.4 GHz and 5 GHz bands for WiFi® (IEEE 802.11) communications and may handle the 2.4 GHz Bluetooth® communications band. Circuitry 18 may be used for handling wireless communications in cellular telephone bands at 850 MHz, 900 MHz, 1800 MHz, 1900 MHz, and 2100 MHz (as examples). Circuitry 18 may also handle voice data and non-voice data. In WiFi® and Bluetooth® links and other short-range wireless links, wireless signals are typically used to convey data over tens or hundreds of feet. In cellular telephone links and other long-range wireless links, wireless signals are typically used to convey data over thousands of feet or miles.

As shown in FIG. 1, a radio-frequency connector such as RF connector 20 may be connected to antenna 16. Similarly, a radio-frequency connector such as RF connector 22 may be connected to transceiver circuitry 18 (e.g., by soldering on a PCB connector adjacent to a transceiver integrated circuit). Transceiver circuitry 18 may be coupled to antenna 16 using a cable such as radio-frequency cable 24 (e.g., RF cable 24 has a first port that connects to RF connector 20 and a second port that connects to RF connector 22). Radio-frequency cable 24 may be a coaxial cable (as an example). If desired, transceiver 18 may be coupled to antenna 16 through transmission line structures such as microstrip transmission lines, stripline transmission lines, edge coupled microstrip transmission lines, edge coupled stripline transmission lines, or other suitable transmission line structures.

Storage and processing circuitry 14 and transceiver circuitry 18 may be manufactured on integrated circuits using complementary metal-oxide-semiconductor (CMOS) technology and other semiconductor technologies. Some of all of antennas 16 may be formed on a flexible substrate (e.g., a flexible substrate formed from sheets of polymer such as polyimide) using roll-to-roll processing (also referred to as "web" processing, reel-to-reel processing, or R2R processing).

Devices formed on flexible printed circuits ("flex circuits") may be reliable and inexpensive to manufacture. Flex circuits have the ability to flex during assembly or to conform to a desired shape within a device housing. It may be desirable to monitor the performance of circuitry formed on flex circuits for quality control, because non-ideal manufacturing conditions may result in undesirable process variations that could adversely affect antenna performance.

Figure 2:
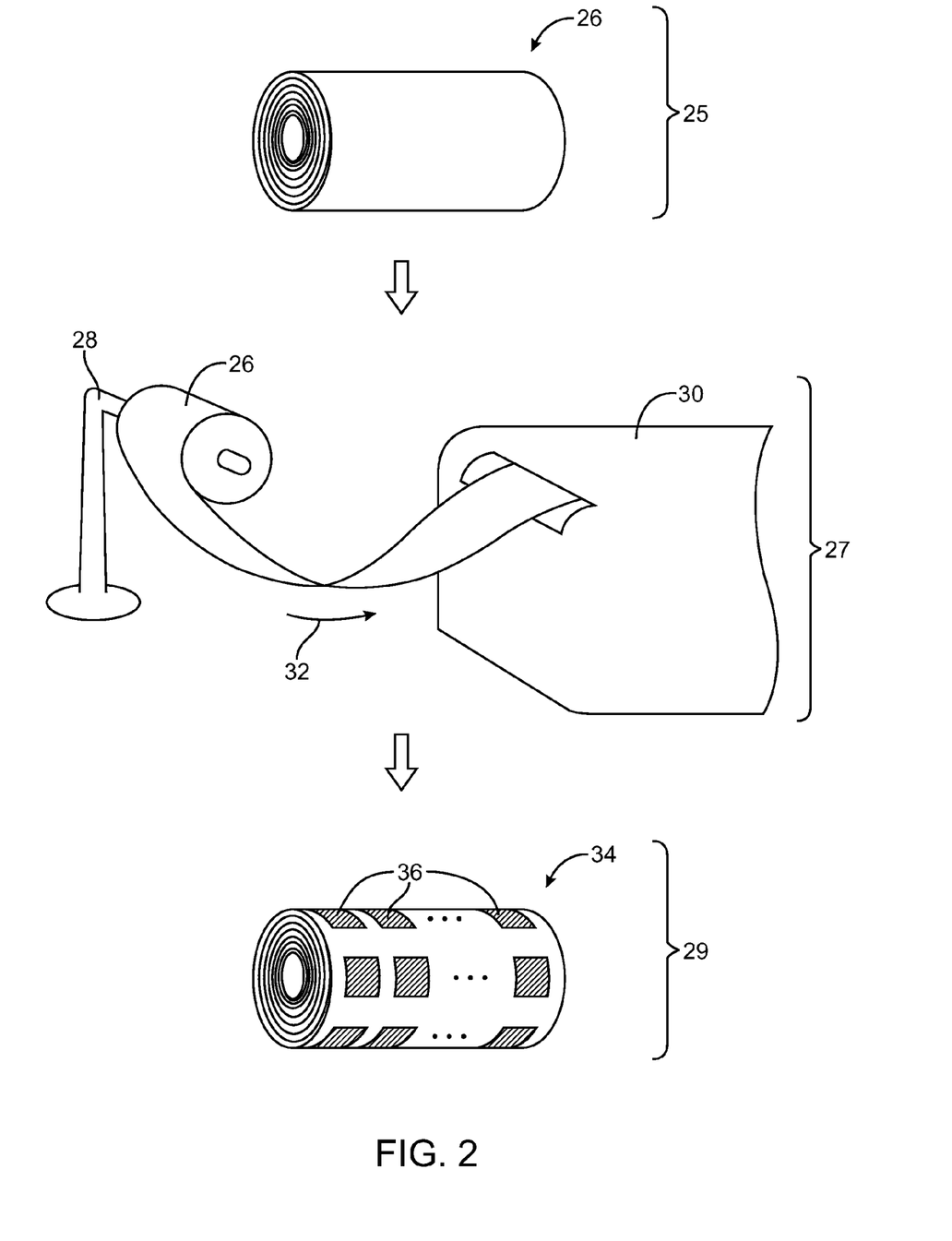
FIG. 2 is a diagram illustrating roll-to-roll processing of flex circuits in accordance with an embodiment of the present invention.

FIG. 2 shows steps involved in forming (patterning) circuitry on a flex circuit. A blank roll of flex circuit 26 may be provided (step 25). The base material for used to manufacture roll 26 may be flexible polymers such as polyimide (PI), polyester (PET), epoxy, acrylic, or other suitable dielectric materials.

At step 27, roll 26 may be supported by a support structure such as structure 28. Blank flex circuit 26 may be unrolled and fed in the direction of arrow 32 to manufacturing tools such as flex circuit manufacturing tools 30.

Flex circuit manufacturing tools 30 may be used to pattern circuitry on flex circuit 26 using pad printing, screen printing, or other deposition techniques. If desired, structures may be formed using photolithography technology. For example, circuitry formed using this approach may involve forming a blanket layer of conductive material (e.g., copper), applying a layer of photoresist, exposing the photoresist through a mask (e.g., a mask that delineates the desired conductive pattern), developing the photoresist to form a photoresist pattern, etching away unwanted conductive portions (e.g., exposed copper may be dissolved using etchant), and then stripping the photoresist pattern.

Manufacturing tools 30 may include tools such as drills (e.g., drills for making through holes in flex circuit 26), a metal plating machine (e.g., a machine for plating the through holes with copper to electrically connect the different layers in multilayer flex circuits), an exposure machine (e.g., a machine for exposing photoresist during photolithography), an etching machine (e.g., a machine for removing the unwanted copper from the surfaces of the flex circuit), a printer (e.g., a tool for performing silk screen printing), etc.

As shown in step 29 of FIG. 2, a flex circuit such as flex circuit 34 with structures 36 may be created after roll 26 has been processed by manufacturing tools 30. Structures 36 formed on flex circuit 34 may include passive wiring (interconnect) structures, antenna traces, integrated circuits, flip chips, surface mount technology (SMT) components, etc.

Forming blocks of circuitry 36 on flex circuit 34 in this way may be reliable and inexpensive relative to forming circuits using CMOS technology. The process shown in FIG. 2 is merely illustrative. If desired, other types of patterning that can be used to form circuitry on flex circuit 26 may include screen printing, inkjet printing, pad printing, laser ablation, etc.

Figure 3:
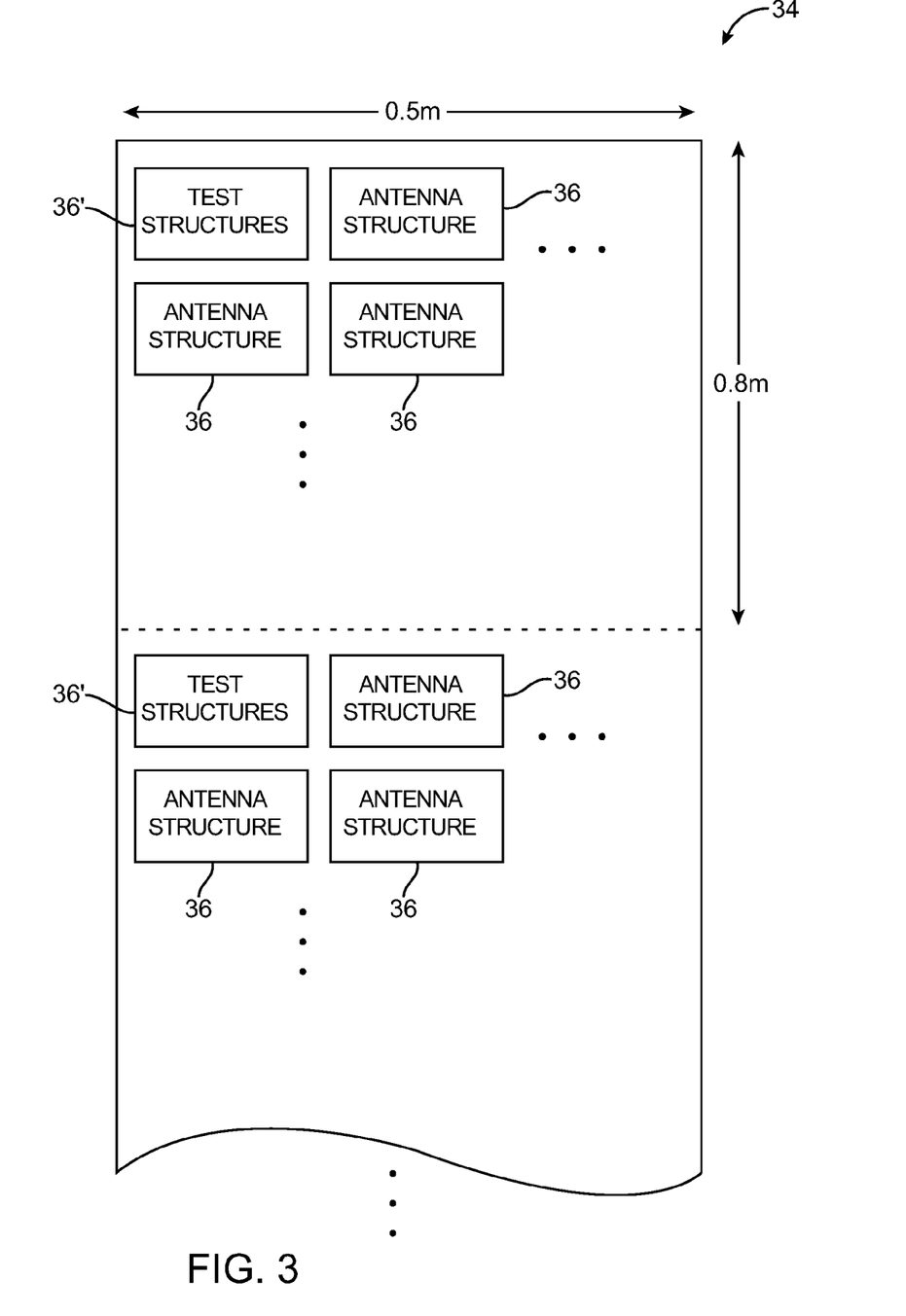
FIG. 3 is a diagram showing different structures that can be formed on a flex circuit in accordance with an embodiment of the present invention.

As shown in FIG. 3, flex circuit 34 may include structures such as antenna structures 36 and test structures 36'. Test structures 36' may include control (token) test structures that can be measured to ensure that flex circuit 34 and antenna structures 36 patterned on circuit 34 exhibit desired properties.

Flex circuit 34 may, for example, be 0.5 m in width and hundreds of meters in length. Flex circuit 34 may have any desired dimensions. As shown in FIG. 3, test structures 36' may be periodically formed on flex circuit 34 (e.g., there may be one block of test structures 36' every 0.8 m in length). Each block of test structures 36' or sample blocks of test structures 36' on circuit 34 may be measured after manufacturing processes to determine whether flex circuit 34 meets pass/fail criteria. If desired, other circuitry may be formed on flex circuit 34.

Figure 4:
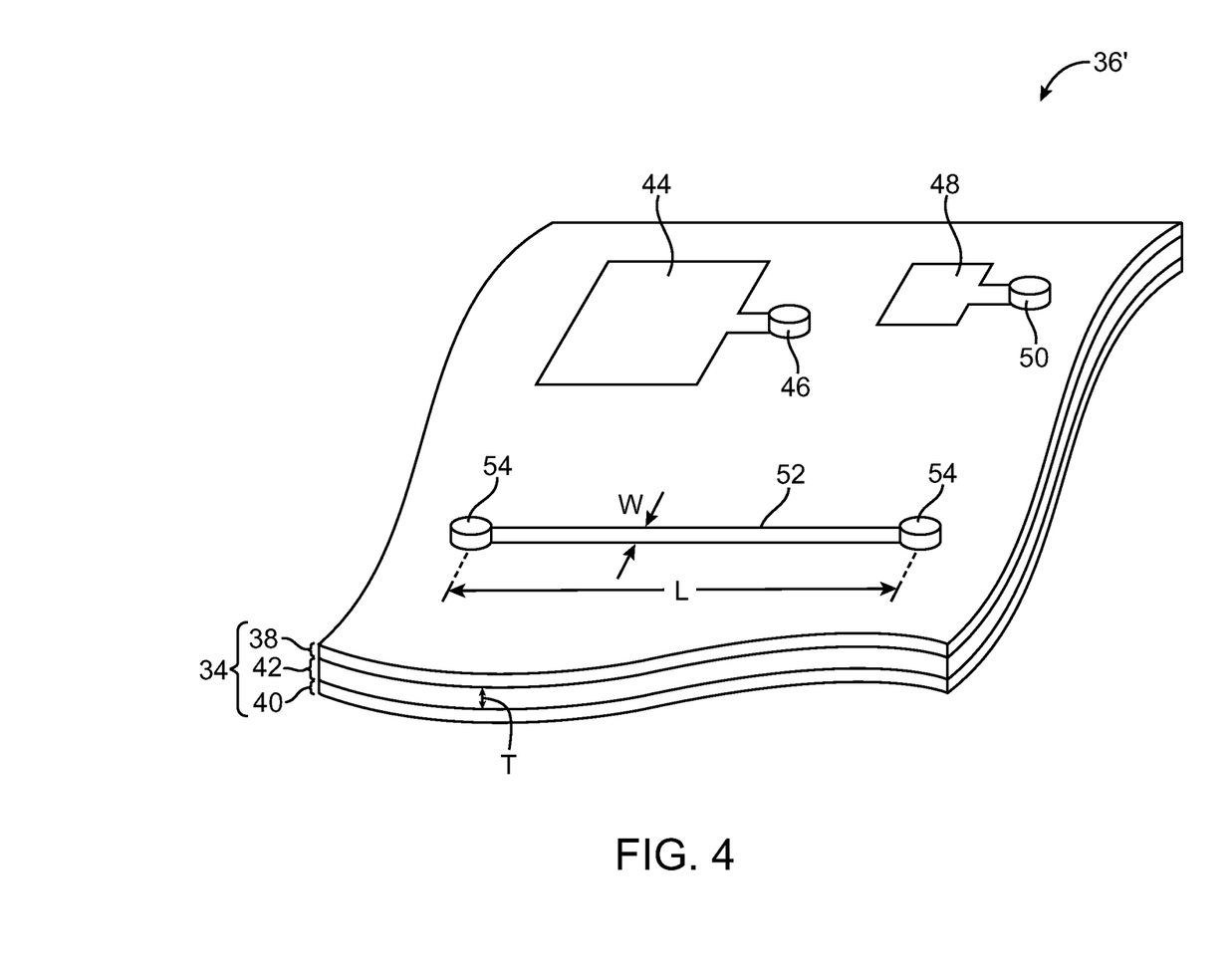
FIG. 4 is a perspective view of illustrative test structures that may be formed on a flex circuit in accordance with an embodiment of the present invention.

As shown in FIG. 4, each block of test structures 36' may include test structures such as first capacitor 44, second capacitor 48, and conductive line (transmission line) 52. These test structures may be tested to obtain information regarding the properties of flex circuit 34 and the circuitry formed on flex circuit 34.

It may be desirable to measure flex circuit properties such as flex circuit thickness (e.g., the thickness of the flexible dielectric material stacked between top and bottom conductive layers) and sensitivity to edge effects. The sensitivity to edge effects may reflect the accuracy and precision of manufacturing tools used to pattern flex circuit 34. It may also be desirable to measure the characteristic impedance of a transmission line. Measuring and monitoring these parameters can help increase yield (e.g., yield of passing antenna structures 36), because flex circuit thickness, sensitivity to edge effects, and characteristic impedance of transmission lines are parameters that directly impact the performance of antenna structures 36.

First capacitor 44 may be measured to determine a ratio of the flex circuit dielectric constant to thickness T of flex circuit 34, whereas second capacitor 48 may be measured to characterize potential edge effects (as examples). First capacitor 44 may be connected to a first connector such as connector 46, whereas second capacitor 48 may be connected to second connector 50. Test equipment may be connected to connectors 46 and 48 to accurately measure the capacitance of capacitors 44 and 48.

Capacitors 44 and 48 may be parallel plate capacitors (e.g., capacitors with a top conductive plate in a top patterning layer 38 of flex circuit 34 and a corresponding bottom conductive plate with the same shape as the top conductive plate in a bottom patterning layer 40 of flex circuit 34). The capacitance of a parallel plate capacitor can be calculated as shown in equation 1.

$$C = \epsilon * A/T \tag{1}$$

Capacitance C is equal to the product of the permittivity of dielectric material ($\epsilon$) in intermediate dielectric layer 42 (see, e.g., FIG. 4) and the area of one of the conductive plates (A) divided by the distance that separates the top plate from the bottom plate (e.g., thickness T of flexible dielectric layer 42).

First capacitor 44 may be measured to determine $\epsilon/T$. First capacitor 44 may, for example, have an area of 25 mm$^2$ (5 mm by 5 mm). A capacitor with such dimensions may have a relatively well controlled and predictable area. The capacitance of capacitor 44 may be accurately measured during test operations (e.g., by connecting the test equipment to capacitor 44 through connector 46). The ratio of $\epsilon/T$ may then be calculated, because the capacitance and area are known. For example, if capacitor 44 has an area of 25 mm$^2$ and a measured capacitance of 15 pF, the $\epsilon/T$ ratio can be calculated to be equal to $6*10^{-7}$ F/m$^2$ ($15*10^{-12}/(25*10^{-6})$).

In a scenario in which $\epsilon$ is known, thickness T can then be calculated. For example, if the $\epsilon/T$ ratio is equal to $6*10^{-7}$ F/m$^2$ and $\epsilon$ for polyimide is known to be $3.4*8.854*10^{-12}$ F/m, then thickness T can be calculated to be equal to approximately 50 μm ($3.4*8.854*10^{-12}/(6*10^{-7})$). Typical flex circuit thickness T can range from 10 μm to 150 μm. Generally, a thicker flex circuit board (e.g., a flex circuit with thickness greater than 100 μm) tends to be more stiff, while a thinner flex circuit board (e.g., a flex circuit with thickness less than 50 μm) tends to be more flexible. Thickness T that is less than 10 μm or more than 150 μm may be manufactured, if desired.

Second capacitor 48 may be measured to characterize potential edge effects. Second capacitor 48 may have a relatively smaller area than first capacitor 44. Capacitor 44 may, for example, have a target area of 0.25 mm$^2$ (0.5 mm by 0.5 mm). A capacitor with such dimensions may be subject to edge effects (e.g., the capacitance may be sensitive to slight variations in the size and shape of the edges of the conductive plates because the edges in a small capacitor make up a larger part of the capacitor than in a large capacitor).

The capacitance of capacitor 48 may be accurately measured during test operations (e.g., by connecting the test equipment to capacitor 48 through connector 50). The actual area may be calculated, because the capacitance and the $\epsilon/T$ ratio are known (e.g., the capacitance is measured using the test equipment, whereas the $\epsilon/T$ ratio is obtained from testing capacitor 44). For example, if capacitor 48 has a capacitance of 0.14 pF and the $\epsilon/T$ ratio is known to be $6*10^{-7}$ F/m$^2$, the actual area can be calculated to be equal to 0.23 mm$^2$ ($0.14*10^{-12}/(0.23*10^{-6})$). In this example, an 8% ((25−23)/

25*100) discrepancy between the target area and the actual area may not be tolerable. Second capacitor 48 may have any area that is small enough to manifest the impact of edge effects.

Test transmission line 52 formed on top patterning layer 38 of flex circuit 34 may have a first terminal that is connected to a first RF connector 54 and a second terminal that is connected to a second RF connector on 54, as shown in FIG. 4. Bottom layer 40 may serve as a ground plane for transmission line 54 (as an example) and may be connected to the ground terminals of connectors 54 using vias. Transmission line 52 may have a width W and a length L. For example, transmission line 52 may have a width W of 0.5 mm and a length of 5 cm. Transmission line 52 may be connected to test equipment through connectors 54 to measure a characteristic impedance of line 52. A typical target characteristic impedance value for radio-frequency circuitry is 50 ohms (as an example).

Flex circuits 34 of the type described in connection with FIG. 4 are merely illustrative. Flex circuit 34 may be a single-sided flex circuit (e.g., a flex circuit with a single conductive layer), a double-sided flex circuit (e.g., a flex circuit with two conductive layers), or a flex circuit with more than two conductive layers separated by flexible dielectric layers. Other test structures 36' may be formed on flex circuit 34 to test for other flex circuit properties, if desired.

Figure 5:
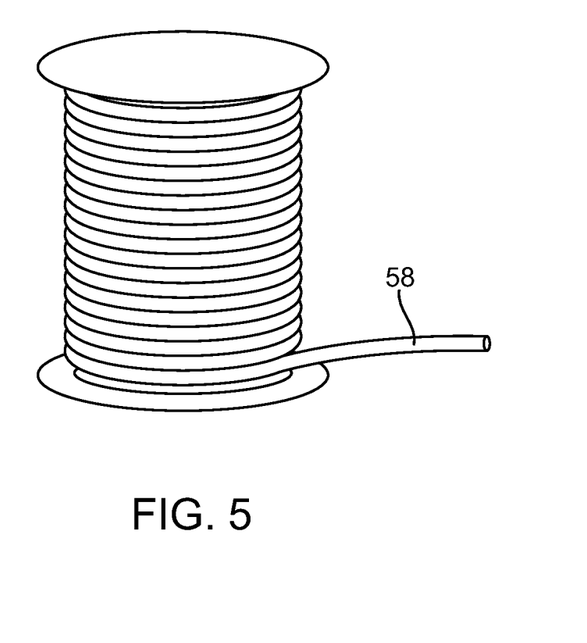
FIG. 5 is a perspective view of an illustrative spool of radio-frequency cable that may be used to connect wireless circuitry in a wireless electronic device in accordance with an embodiment of the present invention.

In addition to testing and monitoring antenna structures 36 formed on flex circuit 34, the performance of RF cable 24 that is used to connect antenna 16 and transceiver 18 (FIG. 1) may also be tested. FIG. 5 shows a spool of RF cable 58. RF cable 58 may be a coaxial cable suitable for transmission of radio-frequency signals. RF cable 58 may be sectioned into smaller segments 24 prior to assembly in device 10.

Figure 6:
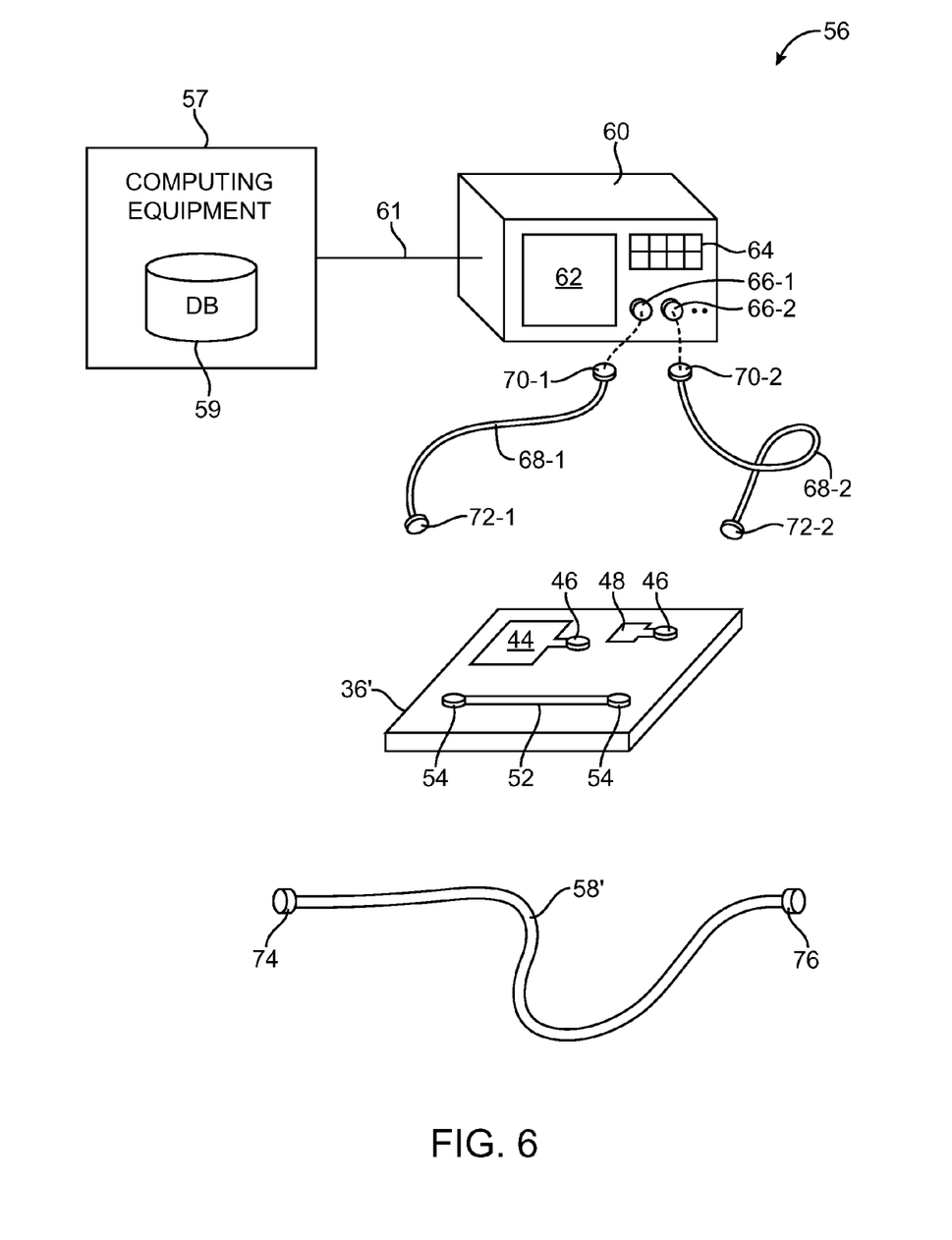
FIG. 6 is diagram of illustrative test equipment that may be used to measure flex circuit properties and radio-frequency cable performance in accordance with an embodiment of the present invention.

During test operations, test structures 36' and sample RF cable segment 58' may be tested in a test system such as test system 56 (FIG. 6). Test system 56 may include a test station having a test unit 60 and radio-frequency test cables (e.g., RF test cables 68-1 and 68-2). Test system 56 may include more than one test station for higher test throughput, if desired.

Test unit (tester) 60 may be a radio communications tester of the type that is sometimes referred to as a test box such as a vector network analyzer (VNA). Testers of this type may perform accurate capacitance and impedance measurements, plot transfer characteristics, and perform radio-frequency signaling tests for a variety of different radio-frequency communications bands and channels. If desired, other types of radio-frequency test equipment may be used (e.g., signal generators and power meters, capacitance meters, etc.).

Test unit 60 may be operated directly or via computer control. When operated directly, a user may control test unit 60 by supplying commands directly to the test unit using the user input interface of the test unit. For example, a user may press buttons in control panel 64 on the test unit while viewing information that is displayed on display 62 in the test unit. In computer controlled configurations, computing equipment such as computer 57 (e.g., software running autonomously or semi-autonomously on the computer) may communicate with the test unit (e.g., by sending and receiving data over wired path 61 or a wireless path between the computer and the test unit).

Test unit 60 may have test unit connectors such as test unit connectors 66-1 and 66-2 through which test signals may be conveyed, as shown in FIG. 6. A first RF test cable such as RF test cable 68-1 may have first and second ports that have first and second RF connectors 70-1 and 72-1, respectively. Similarly, a second RF cable such as RF test cable 68-2 may have first and second ports that have first and second RF connectors 70-2 and 72-2, respectively. First connector 70-1 of test cable 68-1 may be connected to connector 66-1 of test unit 60, while first connector 70-2 of test cable 68-2 may be connected to connector 66-2 of test unit 60. Test unit 60 may have more than two test connectors (ports), if desired.

Capacitor 44 may be connected to test unit 60 to measure its capacitance value (e.g., by connecting connector 72-1 of test cable 68-1 to connector 46 of capacitor 44). Similarly, capacitor 48 may be connected to test unit 60 to measure its capacitance value (e.g., by connecting connector 72-2 of test cable 68-2 to connector 46 of capacitor 48). Transmission line 52 may also be connected to test unit 60 to measure its characteristic impedance (e.g., by connecting connectors 72-1 and 72-2 of test cables 68-1 and 68-2 to first and second connectors 54 of transmission line 52, respectively).

Sample RF cable segment 58' may be connected to test unit 60 to measure its cable loss at desired frequencies (as an example). Segment 58' may, for example, have a length of 10 m. Sample segment 58' may have one end that is connected to RF connector 74 and another end that is connected to RF connector 76. During testing, cable segment 58' may be connect to test unit 60 through the RF test cables (e.g., by connecting connectors 74 and 76 to connectors 72-1 and 72-2 of test RF cables 68-1 and 68-2, respectively) or directly to the test ports of test unit 60 (e.g., by connecting connectors 74 and 76 directly to connectors 66-1 and 66-2 of test unit 60, respectively). Segment 58' may be shorter than 10 m or longer than 10 m, if desired. Other RF cable parameters such as cable termination impedance may also be measured, if desired.

As shown in FIG. 6, test unit 60 may be connected to computing equipment 57 through line 61. Computing equipment 57 may have storage equipment such as database 59. Measurement data (e.g., measured capacitance values, measured transmission line characteristic impedance values, measured cable loss values, etc.) may be stored on database 59.

Figure 7:
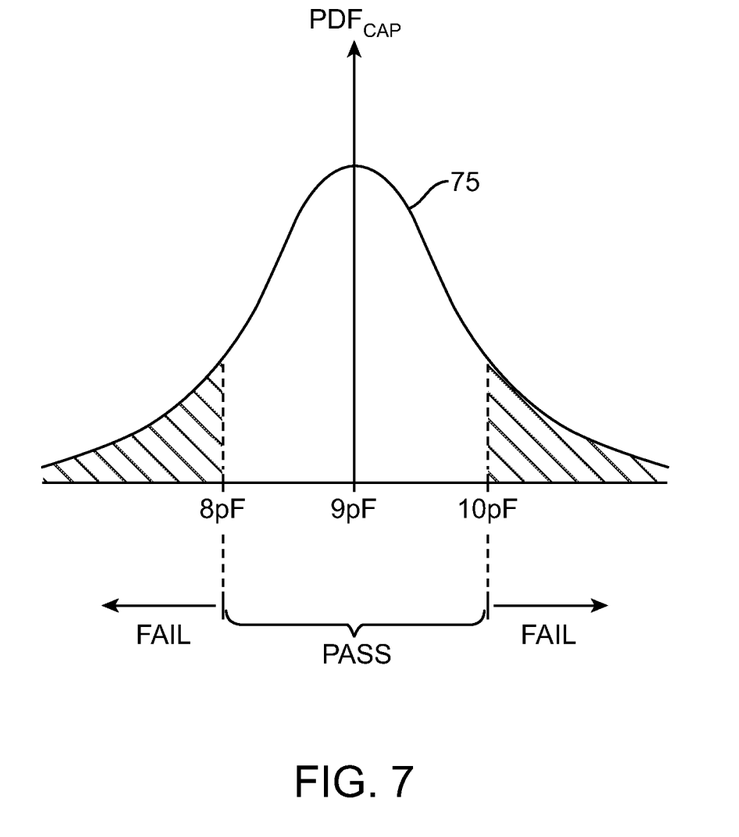
FIG. 7 is an illustrative probability density function (PDF) of measured capacitance values in accordance with an embodiment of the present invention.

It may be challenging to form capacitors with identical capacitance values, because of non-ideal manufacturing conditions that may arise during processing of flex circuit 34. The variation in measured test structure capacitance values may be characterized by a probability density function (PDF) such as probability density function $PDF_{CAP}$, as shown in FIG. 7. In general, a probability density function plots the relative likelihood that a parameter with a particular value will occur. $PDF_{CAP}$ plots the probability (or frequency) for a given capacitance to occur as a function of capacitance.

For example, $PDF_{CAP}$ has a peak that corresponds to a nominal capacitance value of 9 pF (e.g., most capacitors will have a capacitance value of 9 pF, because the peak in a PDF corresponds to most frequent occurrence). Capacitors with capacitance values that deviate from the nominal target value of 9 pF may be formed with less frequent occurrence (e.g., the number of capacitors with a measured capacitance of 9 pF is greater than the number of capacitors with a measure capacitance of 8.3 pF or 9.5 pF). In general, capacitors with capacitance values that deviate further from the nominal value occur less frequently than capacitors with capacitance values that are relatively close to the nominal value.

Curve 75 may be produced based on measured data. Curve 75 may be continuously updated based on newly gathered data to take into account most recently gathered capacitance measurements. All measured capacitance data may be stored and maintained on database 59 of FIG. 6.

Pass/fail criteria may be applied to the measured capacitance levels to determine whether the flex circuit on which the measured capacitors are formed is a passing flex circuit or a failing flex circuit (e.g., capacitance values that are less than 8 pF or more than 10 pF may result in a failing sample, as indicated by the shaded regions underneath curve 75 in FIG. 7). Antenna structures 36 formed on passing flex circuits may be used in manufacturing production devices 10, while failing flex circuits may be discarded.

For example, if a test capacitor has a measured capacitance of 8.1 pF, flex circuit 34 may be marked as a passing flex circuit. If a test capacitor has a measured capacitance of 10.2 pF, flex circuit 34 may be marked as a failing flex circuit.

A certain threshold may need to be met before marking a roll of flex circuit 34 as a failing sample. For example, a roll of flex circuit may include 100 test structures 36' each having a test capacitor. During test operations, only 20 out of 100 test capacitors may be sampled and measured. If one out of 20 measured capacitors exhibit capacitance in the failing regions, the roll of flex circuit may still be acceptable (e.g., marked as a passing flex circuit). If two out of 20 measured capacitors exhibit capacitance in the failing regions, the roll of flex circuit may be unacceptable (e.g., marked as a failing flex circuit). Other pass/fail schemes may be applied to each roll of flex circuit, if desired. For example, all antenna structures in the vicinity of a test circuit can be used or discarded based on whether the test circuit passes or fails testing.

Figure 8:
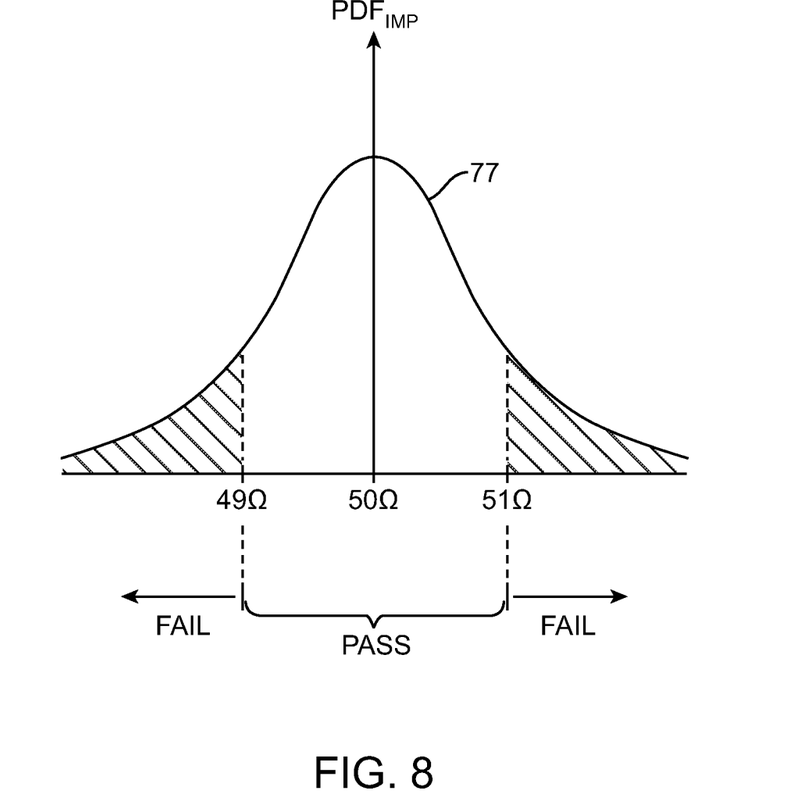
FIG. 8 is an illustrative probability density function (PDF) of measured transmission line characteristic impedance values in accordance with an embodiment of the present invention.

It may be challenging to form transmission lines with identical characteristic impedance values, because of non-ideal manufacturing conditions that may arise during processing of flex circuit 34. The variation in impedance may be characterized by probability density function $PDF_{IMP}$, as shown in FIG. 8. $PDF_{IMP}$ plots the probability (or frequency) for a given impedance (resistance) to occur as a function of impedance.

For example, $PDF_{IMP}$ has a peak that corresponds to a nominal impedance value of 50 ohms (e.g., most transmission lines will have a characteristic impedance value of 9 50 ohms). Transmission lines with impedance values that deviate further from the nominal value occur less frequently than transmission lines with impedance values that are relatively closer to the nominal value.

Curve 77 may be produced based on measured data. Curve 77 may be continuously updated based on newly gathered data to take into account most recently measured impedance values. All measured impedance data may be stored and maintained on database 59 of FIG. 6.

Pass/fail criteria may be applied to the measured impedance levels to determine whether flex circuit 34 on which the measured transmission lines are form is a passing flex circuit or a failing flex circuit (e.g., impedance values that are less than 49 ohms or more than 51 ohms may result in a failing sample, as indicated by the shaded regions underneath curve 77 in FIG. 8). Antenna structures 36 formed on passing flex circuits may be assembled in production devices 10, while failing flex circuits may be discarded.

For example, if a transmission line has a measured impedance of 50.8 ohms, flex circuit 34 may be marked as a passing flex circuit. If a transmission line has a measured impedance of 48.9 ohms, flex circuit 34 may be marked as a failing flex circuit. As described in connection with FIG. 7, a certain failing threshold may need to be met before marking a roll of flex circuit 34 as a failing circuit (e.g., a failing flex circuit should exhibit at least 2% of transmission lines with characteristic impedance values in the failing regions).

Figure 9:
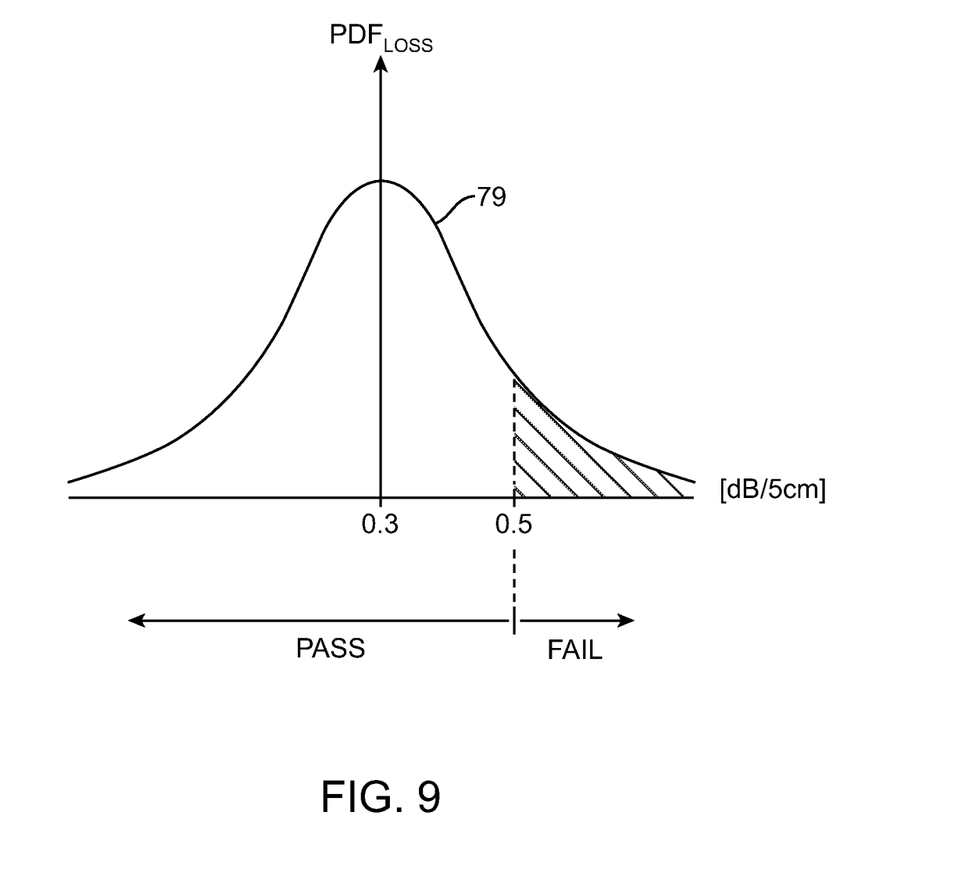
FIG. 9 is an illustrative probability density function (PDF) of measured radio-frequency cable loss values in accordance with an embodiment of the present invention.

As with other manufactured electrical components, it may be necessary to test the performance of RF cables prior to assembly. It is desirable to provide RF cables that exhibit low cable loss (as an example). The variation in cable loss may be characterized by probability density function $PDF_{LOSS}$, as shown in FIG. 9. $PDF_{LOSS}$ plots the probability (or frequency) for a given cable loss to occur as a function of cable loss.

For example, $PDF_{LOSS}$ has a peak that corresponds to a nominal cable loss of 0.3 dB/5 cm (e.g., radio-frequency signals travelling through the cable experiences 3 decibels of signal degradation every 5 cm along the cable). Different portions sampled from a spool of RF cable may exhibit different cable loss values. As a result, various portions of an RF cable may need to be tested.

Curve 79 may be generated using simulation tools (e.g., by running Monte Carlo simulations or other statistical analysis simulations) or may be plotted based on measured data. Curve 79 may be continuously updated based on newly gathered data to take into account most recently gathered cable loss measurements. All measured data associated with RF cables may be stored and maintained on database 59 of FIG. 6.

Pass/fail criteria may be applied to the cable loss levels to determine whether RF cable 58 is a passing cable or a failing cable (e.g., cable loss values that are greater than 0.5 dB/5 cm may result in a failing sample, as indicated by the shaded region underneath curve 79 in FIG. 9). RF cable segments 24 obtained from passing RF cable 58 may be assembled in production devices 10, while failing RF cable 58 may be discarded.

For example, if a sample cable segment 58' has a measured cable loss of 0.1 dB/5 cm, RF cable 58 may be marked as a passing cable. If sample cable segment 58' has a measured cable loss of 0.6 dB/5 cm, RF cable 58 may be marked as a failing cable. If desired, RF cable 58 may be periodically tested during assembly of RF cable segment 24 in device 10, because cable loss can vary from segment to segment. Curve 79 of FIG. 9 represents a cable loss PDF measured at an operating frequency of 1 GHz (as an example). Cable loss data may be tested and monitored at desired frequencies.

Figure 10:
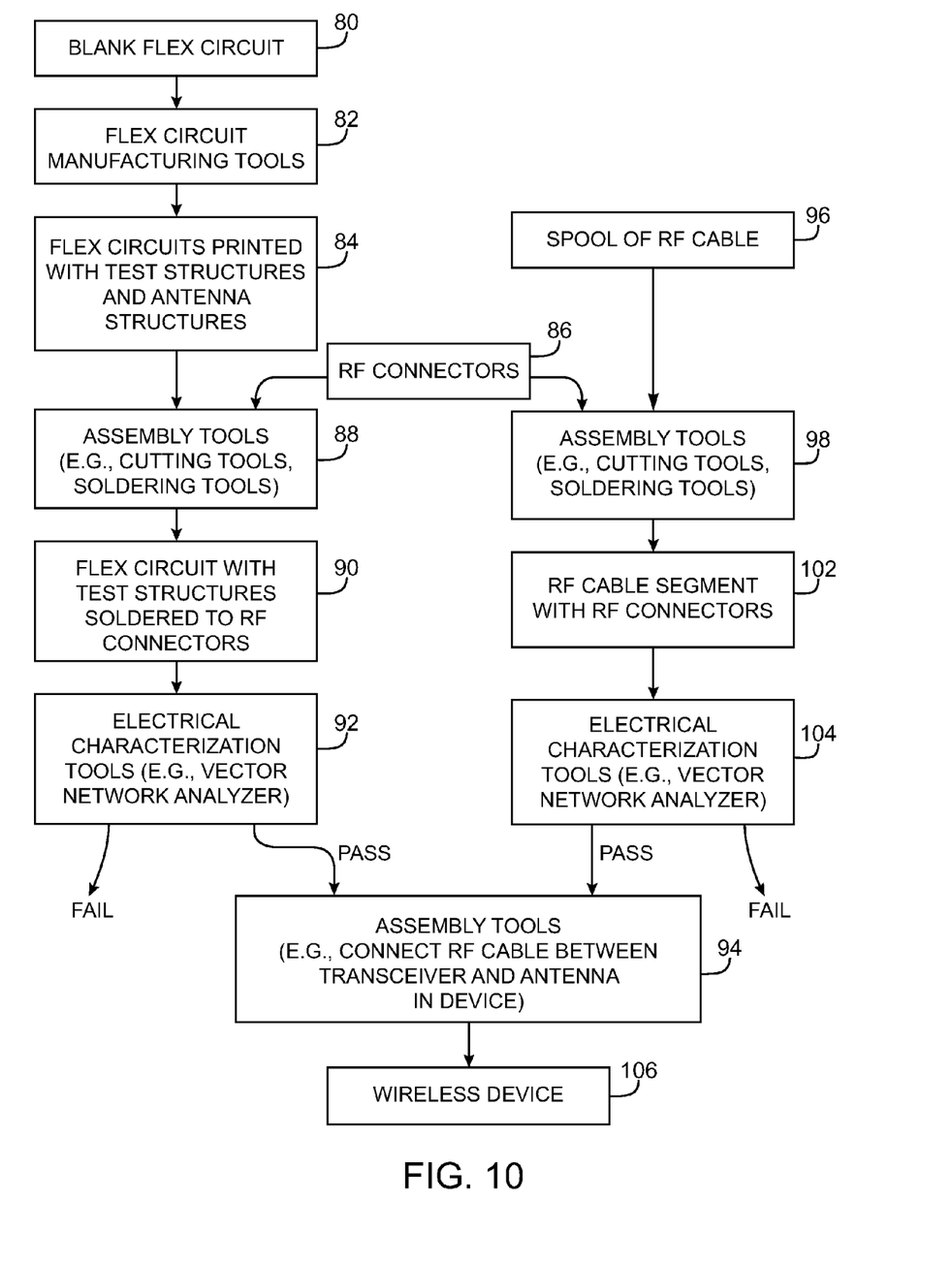
FIG. 10 is a diagram showing illustrative steps involved in monitoring the quality of wireless circuitry formed on flex circuits and the performance of radio-frequency cables in accordance with an embodiment of the present invention.

FIG. 10 shows an illustrative test flow for testing flex circuits and RF cables. Blank flex circuit 80 may initially be provided. Blank flex circuit 80 may be processed using flex circuit manufacturing tools 82. Flex circuit manufacturing tools 82 may form test structures and antenna structures on patterned flex circuit 84.

Patterned flex circuit 84 (e.g., flex circuit with test structures and antenna structures) and RF connectors 86 may be assembled using assembly tools 88 (e.g., cutting tools and soldering tools). The cutting tools may cut flex circuit 84 into smaller portions suitable for testing and assembly. The soldering tools may be used to solder RF connectors 86 to the test structures (e.g., to solder RF connectors to the terminal of each capacitor, to the terminals of each transmission line, etc.). Different samples of flex circuits 90, each of which has test structures soldered to RF connectors 86, may then be provided.

These test structures may be measured using electrical characterization tools 92 (e.g., a vector network analyzer). If the measured flex circuit is a failing flex circuit, the flex circuit may be discarded. If the measured flex circuit is a passing flex circuit, the antenna structures form on that flex circuit may be provided to assembly tools 94 for production device assembly (e.g., each antenna structure formed on the same roll of passing flex circuit may be assembled into a wireless device housing).

Testing of the RF cable may occur in parallel with the testing of the flex circuit, as shown in FIG. 10. A spool of RF cable 96 (e.g., a coaxial cable) may be provided by a cable manufacturing plant. RF cable 96 and RF connectors 86 may be processed by assembly tools 98 (e.g., cutting tools, soldering tools, etc.). The cutting tools may be used to cut RF cable 96 into sample segments that may be used during testing to measure cable loss (as an example). The soldering tools may be used to solder RF connectors 86 to the two ends of each sample cable segment.

Sample cable segments with RF connectors 102 may be provided. Electrical characterization tools 104 may then be used to measure the cable loss of each sample cable segment 102 (as an example). If the measured cable loss values do not satisfy design criteria, RF cable 96 may be discarded. If the measured cable loss values meet the pass/fail criteria, RF cable 96 may be used to connect the transceiver circuitry and the antenna structure in a wireless device during device assembly. After device assembly, wireless device 106 may be powered on and may be used to make or receive telephone calls or to download data wirelessly.

Figure 11:
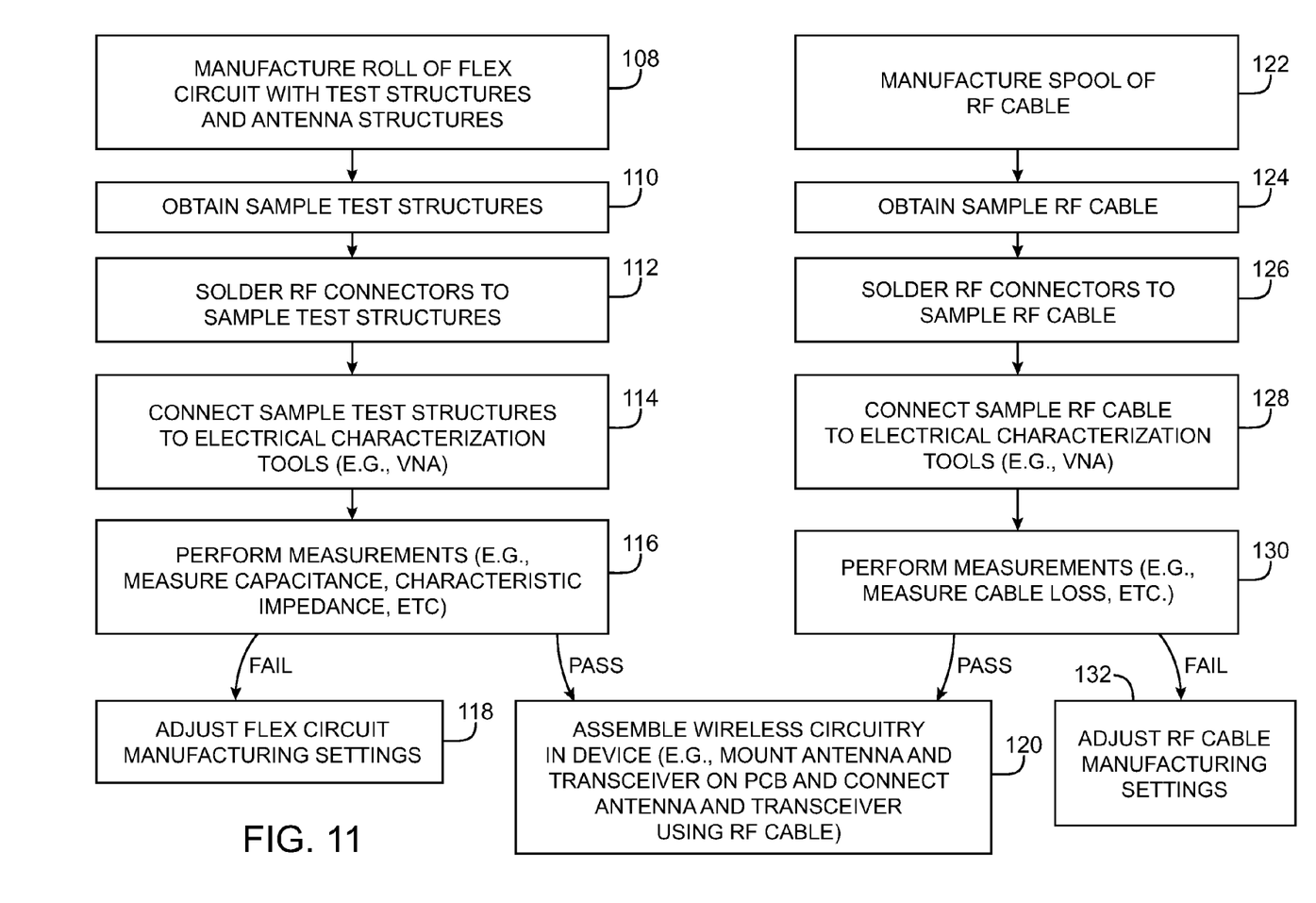
FIG. 11 is a flow chart of illustrative steps involved in testing and assembling wireless circuitry in a wireless electronic device in accordance with an embodiment of the present invention.

FIG. 11 shows illustrative steps involved in testing and monitoring wireless circuitry in wireless device 10. At step 108, a roll of flex circuit with test structures and antenna structures may be manufactured. At step 110, sample test structures may be obtained (e.g., different portions of flex circuit with test structures may be removed from a roll of flex circuit). RF connectors may then be soldered to the different test structures so that the test structures may be connected to test equipment (step 112).

At step 114, the sample test structures may be connected to electrical characterization tools such as a VNA. At step 116, the electrical characterization tools may be used to perform desired measurements (e.g., to measure capacitance of test capacitors, to measure characteristic impedance of test transmission lines, etc.). If the measured values do not meet manufacturing specifications, flex circuit manufacturing settings may be adjusted to correct for the discrepancy (step 118).

At step 122, a spool of RF cable may be manufactured. At step 124, sample RF cable segments may be obtained (e.g., sample segments may be periodically removed from different portions of the RF cable). RF connectors may then be soldered to the terminals of each sample RF cable segment so that the RF cable segments may be connected to test equipment (step 126).

At step 128, the RF cable segments may take turns being connected to a VNA (as an example). At step 130, the VNA may be used to perform measurements on the connected sample cable segment (e.g., to measure cable loss, etc.). If the measured cable loss values do not meet performance criteria, RF cable manufacturing settings may be adjusted to correct for the discrepancy (step 132).

At step 120, antenna structures associated with passing flex circuits and RF cable segments associated with passing sample RF cable segments may be assembled in wireless device 10 (e.g., an RF cable segment may connect an antenna structure to transceiver circuitry mounted within the device housing).

The foregoing is merely illustrative of the principles of this invention and various modifications can be made by those skilled in the art without departing from the scope and spirit of the invention.

What is claimed is:

1. A method of manufacturing wireless electronic devices comprising:
    with flex circuit manufacturing tools, forming a roll of flex circuit that includes antenna structures and test structures;
    with test equipment, measuring the test structures to determine whether the antenna structures satisfy predetermined performance criteria; and
    in response to determining that the test structures satisfy the predetermined performance criteria, incorporating the antenna structures into the wireless electronic devices during production device assembly with assembly tools.

2. The method defined in claim 1 wherein forming the roll of flex circuit comprises:
    with the flex circuit manufacturing tools, forming the antenna structures and the test structures on a blank roll of flex circuit, wherein the test structures include transmission lines and capacitors of different sizes.

3. The method defined in claim 1 wherein the test structures include transmission lines and wherein measuring the test structures comprises:
    with the test equipment, measuring characteristic impedance values of the transmission lines.

4. The method defined in claim 1 wherein the test structures include capacitors and wherein measuring the test structures comprises:
    with the test equipment, measuring capacitance values of the capacitors.

5. The method defined in claim 1 wherein measuring the test structures comprises measuring the test structures with a vector network analyzer.

6. The method defined in claim 1 further comprising forming radio-frequency cable for the wireless electronic devices.

7. The method defined in claim 6, further comprising:
    with the test equipment, measuring cable loss values for a portion of the radio-frequency cable to determine whether the radio-frequency cable satisfies desired performance criteria.

8. The method defined in claim 7, further comprising:
    in response to determining that the portion of the radio-frequency cable satisfies the desired performance criteria, incorporating segments of the radio-frequency cable into the wireless electronic devices.

9. The method defined in claim 8, wherein the wireless electronic devices include transceiver circuitry and wherein incorporating the segments of the radio-frequency cable into the wireless electronic devices comprises connecting the antenna structures to the transceiver circuitry using the segments of the radio-frequency cable in the wireless electronic devices.

10. A method of manufacturing a flex circuit comprising:
    with flex circuit manufacturing tools, forming test structures and antenna structures on the flex circuit; and
    with test equipment, measuring the test structures without testing the antenna structures to determine whether the antenna structures satisfy predetermined performance criteria.

11. The method defined in claim 10 wherein forming the test structures comprises:
    with the flex circuit manufacturing tools, forming test structures on a roll of flex circuit, wherein the test structures include transmission lines and capacitors.

12. The method defined in claim 11 further comprising:
    with assembly tools, soldering radio-frequency connectors to the test structures.

13. The method defined in claim 12 wherein measuring the test structures comprises:
    connecting the radio-frequency connectors that are soldered to the test structures to the test equipment; and
    with the test equipment, performing measurements on the test structures.

14. The method defined in claim 13 wherein performing the measurements on the test structures comprises measuring characteristic impedance values for the transmission lines.

15. The method defined in claim 13 wherein performing the measurements on the test structures comprises measuring capacitance values for the capacitors.

16. The method defined in claim 13 further comprising:
in response to determining that the test structures fail to satisfy the predetermined performance criteria, manufacturing an additional flex circuit.

* * * * *